(12) United States Patent
Sui et al.

(10) Patent No.: US 7,073,611 B2
(45) Date of Patent: Jul. 11, 2006

(54) ION-BEAM ASSISTED DEPOSITION OF INORGANIC COATINGS FOR ELASTOMERIC SEAL WEAR RESISTANCE IMPROVEMENT

(75) Inventors: Ping Sui, The Woodlands, TX (US); Ronghua Wei, San Antonio, TX (US)

(73) Assignee: Halliburton Energy Services, Inc., Carrollton, TX (US)

( * ) Notice: Subject to any disclaimer, the term of this patent is extended or adjusted under 35 U.S.C. 154(b) by 0 days.

(21) Appl. No.: 10/975,192

(22) Filed: Oct. 28, 2004

(65) Prior Publication Data

US 2005/0121312 A1    Jun. 9, 2005

Related U.S. Application Data

(60) Provisional application No. 60/515,055, filed on Oct. 28, 2003.

(51) Int. Cl.
    *E21B 10/24*    (2006.01)

(52) U.S. Cl. .................. 175/57; 175/372; 277/444
(58) Field of Classification Search ............... 175/372; 277/442, 443, 444, 405
    See application file for complete search history.

(56) References Cited

U.S. PATENT DOCUMENTS

| | | | | |
|---|---|---|---|---|
| 5,700,546 A | * | 12/1997 | Fujii et al. | 428/156 |
| 6,063,244 A | * | 5/2000 | Pinarbasi | 204/192.11 |
| 2003/0062200 A1 | * | 4/2003 | Blackman | 175/228 |
| 2003/0104158 A1 | * | 6/2003 | Gui et al. | 428/64.1 |
| 2004/0237840 A1 | * | 12/2004 | Yamamoto et al. | 106/286.4 |

* cited by examiner

*Primary Examiner*—William Neuder

(57) ABSTRACT

Elastomeric seals for use in drill bits on which an inorganic surface modification material has been deposited onto the surface of the elastomeric seals. Wear resistance of the seal at the dynamic surface is improved by providing support for the soft seal surface, by means of the inorganic atoms, against a harder surface.

17 Claims, 15 Drawing Sheets

Electron Beam Evaporation Deposition

Magnetron Sputter Deposition

Test 740-160 Cross-sectional View

Test 740-161 Cross-sectional View

Test 740-162 Cross-sectional View

Test 740-163 Cross-sectional View

ION-BEAM ASSISTED DEPOSITION OF INORGANIC COATINGS FOR ELASTOMERIC SEAL WEAR RESISTANCE IMPROVEMENT

CROSS-REFERENCE TO RELATED APPLICATIONS

This application claims priority from U.S. Provisional Application 60/515,055 filed Oct. 28, 2003, which is hereby incorporated by reference.

FIELD OF THE INVENTION

The present invention relates to elastomeric seals and, more particularly, to improving the wear resistance of elastomeric seals by using ion-beam assisted deposition to coat elastomeric seals with a hard coating.

BACKGROUND AND SUMMARY OF THE INVENTION

Background: Physical Vapor Deposition (PVD)

Physical vapor deposition (PVD) processes (often just called thin film processes) are atomistic deposition processes in which material is vaporized from a solid or liquid source in the form of atoms or molecules, transported in the form of a vapor through a vacuum or low pressure gaseous (or plasma) environment to the substrate where it condenses. FIGS. 1A and 1B are general schematics of the PVD process. Typically, PVD processes are used to deposit films with thicknesses in the range of a few nanometers to thousands of nanometers; however, they can also be used to form multilayer coatings, graded composition deposits, very thick deposits, and freestanding structures. The substrates can range in size from very small to very large such as the 10' by 12' glass panels used for architectural glass. The substrates can range in shape from flat to complex geometries such as watchbands and tool bits. Typical PVD deposition rates are 10–100 Å (1–10 nanometers) per second.

PVD processes can be used to deposit films of elements and alloys as well as compounds using reactive deposition processes. In reactive deposition processes, compounds are formed by the reaction of depositing material with the ambient gas environment such as nitrogen (e.g. titanium nitride, TiN) or with a co-depositing material (e.g. titanium carbide, TiC). Quasi-reactive deposition is the deposition of films of a compound material from a compound source where loss of the more volatile species or less reactive species during the transport and condensation process is compensated for by having a partial pressure of reactive gas in the deposition environment. A more in-depth review of the PVD process can be found in the *Handbook of Physical Vapor Deposition (PVD) Processing—Film Formation, Adhesion, Surface Preparation and Contamination Control*, Soc. Of Vacuum Coaters, Albuquerque, N. Mex. (1998) by Donald M. Mattox which is hereby incorporated by reference.

Background: Ion Implantation

Ion implantation is a high technology approach for modifying surface properties of materials. It is similar to a coating process, but it does not involve the addition of a layer on the surface. Ion implantation utilizes highly energetic beams of ions (positively charged atoms) to modify the surface structure and chemistry of materials at low temperature. The process does not adversely affect component dimensions or bulk material properties.

Many surface properties can be improved with ion implantation including hardness and wear resistance, resistance to chemical attack, and reduced friction. The process can be applied to virtually any material, including most metals, ceramics, and polymers. However, the effects of the process are typically material-specific.

The ion implantation process is conducted in a vacuum chamber at very low pressure ($10^{-4}$–$10^{-5}$ torr). Large numbers of ions (typically $10^{-16}$–$10^{-17}$ ions/cm$^2$) bombard and penetrate a surface, interacting with the substrate atoms immediately beneath the surface. Typical depth of ion penetration is a fraction of a micron (or a few millionths of an inch). The interactions of the energetic ions with the material modify the surface, providing it with significantly different properties than the remainder of the material. Specific property changes depend on the selected ion beam treatment parameters, for instance the particular ion species, energy, and total number of ions that impact the surface.

Ions are produced via a multi-step process in a system such as that shown schematically in FIG. 2. Ions are initially formed by stripping electrons from source atoms in a plasma. The ions are then extracted and pass through a mass-analyzing magnet, which selects only those ions of a desired species, isotope, and charge state. The beam of ions is then accelerated using a potential gradient column. Typical ion energies are 10–200 keV. A series of electrostatic and magnetic lens elements shapes the resulting ion beam and scans it over an area in an end station containing the parts to be treated. Ion implantation offers numerous advantages for treating component surfaces. A primary benefit is the ability to selectively modify the surface without detrimentally affecting bulk properties, largely because the process is carried out at low substrate temperatures. The process is also extremely controllable and reproducible and can be tailored to modify different surfaces in desired ways. Although it is a line-of-sight process, specialized fixturing may be used to uniformly treat complex geometries.

Background: Ion-Beam Assisted Deposition (IBAD)

Ion-beam assisted deposition (IBAD) utilizes two physical processes in high vacuum: ion implantation and physical vapor deposition (PVD).

In IBAD, metal or oxide targets are placed at the evaporator and used for thin film deposition. The ion beam can be generated from noble gases or from gases like nitrogen or oxygen (with additional chemical influence on the layer deposition leading to changed stoichiometry of nitrides or oxides).

Ion bombardment is the key factor controlling film properties in the IBAD process. As in ion implantation, the ions impart substantial energy to the coating and coating/substrate interface. This achieves the benefits of substrate heating (which generally provides a denser, more uniform film) without significantly heating the substrate material and degrading bulk properties. The ions also interact with coating atoms, driving them into the substrate and producing a graded material interface, which enhances adhesion. These factors combine to allow the deposition of uniform, adherent, low-stress films of virtually any coating material on most substrates, including extremely adherent metal coatings on polymers. Therefore, IBAD allows high quality depositions, where conventional PVD coatings fail. FIG. 3 is a general schematic of the IBAD process.

Background: Rotary Drilling

Oil wells and gas wells are drilled by a process of rotary drilling. In a conventional drill rig, as seen in FIG. 4, a drill bit 10 is mounted on the end of a drill string 12 (drill pipe plus drill collars), which may be several miles long. At the surface, a rotary drive turns the string, including the bit 10 at the bottom of the hole, while drilling fluid (or "mud") is pumped through string 12 by very powerful pumps.

When the bit wears out or breaks during drilling, it must be brought up out of the hole. This requires a process called "tripping": a heavy hoist pulls the entire drill string out of the hole, in stages of (for example) about ninety feet at a time. After each stage of lifting, one "stand" of pipe is unscrewed and laid aside for reassembly (while the weight of the drill string is temporarily supported by another mechanism). Since the total weight of the drill string may be hundreds of tons and the length of the drill string may be tens of thousands of feet, this is not a trivial job. One trip can require tens of hours and is a significant expense in the drilling budget. To resume drilling, the entire process must be reversed. Thus, the bit's durability is very important to minimize round trips for bit replacement during drilling.

Two main types of drill bits are in use; one being the roller cone bit. FIG. 5 shows an example of a complete bit (of the insert type) in which a set of rotary cones 14, each having many teeth or cutting inserts 16, is mounted on rugged bearings on an arm 18. The bit's teeth must crush or cut rock with the necessary forces supplied by the "weight on bit" (WOB) which presses the bit down into the rock and by the torque applied at the rotary drive. While the WOB may in some cases be 100,000 pounds or more, the forces actually seen at the drill bit are not constant: the rock being cut may have harder and softer portions (and may break unevenly), and the drill string itself can oscillate in many different modes. Thus, the drill bit must be able to operate for long periods under high and variable stresses in a remote environment.

As the drill bit rotates, the roller cones roll on the bottom of the hole. The weight-on-bit forces the downward pointing teeth of the rotating cones into the formation being drilled, applying a compressive stress which exceeds the yield stress of the formation and thus inducing fractures. The resulting fragments are flushed away from the cutting face by a high flow of drilling fluid.

Background: The Importance of Seals in Drilling

The flow of the mud is one of the most important factors in the operation of the drill bit, serving both to remove the cuttings which are sheared from rock formations by the drill bit and also to cool the drill bit and teeth (as well as other functions). However, the fragments of rock in the mud (which are constantly being released at the cutting face) make the mud a very abrasive fluid.

At least one seal is normally designed into the arm/cone joint to exclude the abrasive cuttings-laden mud from the bearings.

FIG. 6 is a sectional view of a portion of a roller cone bit. Seen in outline is the external surface of the roller cone 10, while the journal 20 with roller bearings 22 and ball bearings 24 are seen as they fit in the cone. The seal 26 and gland 28, which lie within the cone as it rotates around the journal, are seen in a cut-away that shows their cross-section.

The special demands of sealing the bearings of roller cone bits are particularly difficult. The drill bit is operating in an environment where the turbulent flow of drilling fluid, which is loaded with particulates of crushed rock, is being driven by hundreds of pump horsepower. The flow of mud from the drill string may also carry entrained abrasive fines. When the seal fails, the abrasive cuttings-laden mud will very rapidly destroy the bearings. Thus, the seal is a very critical factor in bit lifetime and may indeed be the determining factor.

Background: Prior Attempts at Improving the Wear Resistance of Drill Bit Seals

Prior attempts at improving the wear resistance of drill bit seals include adding an organic material to the surface of the seal. For example, in U.S. Pat. No. 5,456,327 to Denton et al., the surface of the seal was modified with organic materials such as metal disulfides, fluoropolymers, polyethylene polymers, silicone polymers, and urethane polymers. These organic materials improved the wear resistance of the seals by minimizing sticking between the seal surface and adjacent surfaces which minimizes the material loss at the seal surface resulting from stick-slip. Other examples of seals treated with an organic material include the Fluoroelastomer 742 seal from Chemraz™.

Background: Shortcomings of Organic Coatings

Organic coatings improve wear resistance of the seal at the dynamic surface by reducing the sticking between the seal surface and the adjacent surfaces. However, these coatings fail to provide support for the soft seal surface against a harder surface. The soft surface of the elastomeric seal is still in contact with hard surfaces.

Also, organic coatings do not protect the seal against abrasive particles. Abrasive particles tend to accumulate near the front edge of the sealing area. The abrasive conglomerates will wear away the seal to result in a secondary wear region. This, in turn, allows more accumulation of the abrasive particles and accelerates the penetration of wear particles into the sealing area.

Ion-Beam Assisted Deposition of Inorganic Coatings for Elastomeric Seal Wear Resistance Improvement:

The present innovations relate to elastomeric seals for use in drill bits on which an inorganic surface modification material has been deposited onto the surface of the preferably elastomeric seals. In a preferred embodiment, the inorganic surface modification material is deposited onto the surface of the seals by means of ion-beam assisted deposition (IBAD), though other methods could be used.

Wear resistance of the seal at the dynamic surface is improved by the addition of the inorganic coating. The harder surface provides support for the soft seal surface and also provides protection against the abrasive particles that tend to accumulate near the front end of the sealing area. The abrasive conglomerates will wear away the seal to produce a secondary wear region. This, in turn, allows more accumulation of the abrasive particles a accelerates the penetration of wear particles into the sealing area. Accordingly, the inorganic coating has a tendency not only to reduce the wear in the primary sealing area but also in the secondary wear area.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment (by way of example, and not of limitation).

The present inventors have discovered a new way to improve the wear resistance of seals used in drill bits, and thereby greatly extend bit lifetime.

Figure 1A:
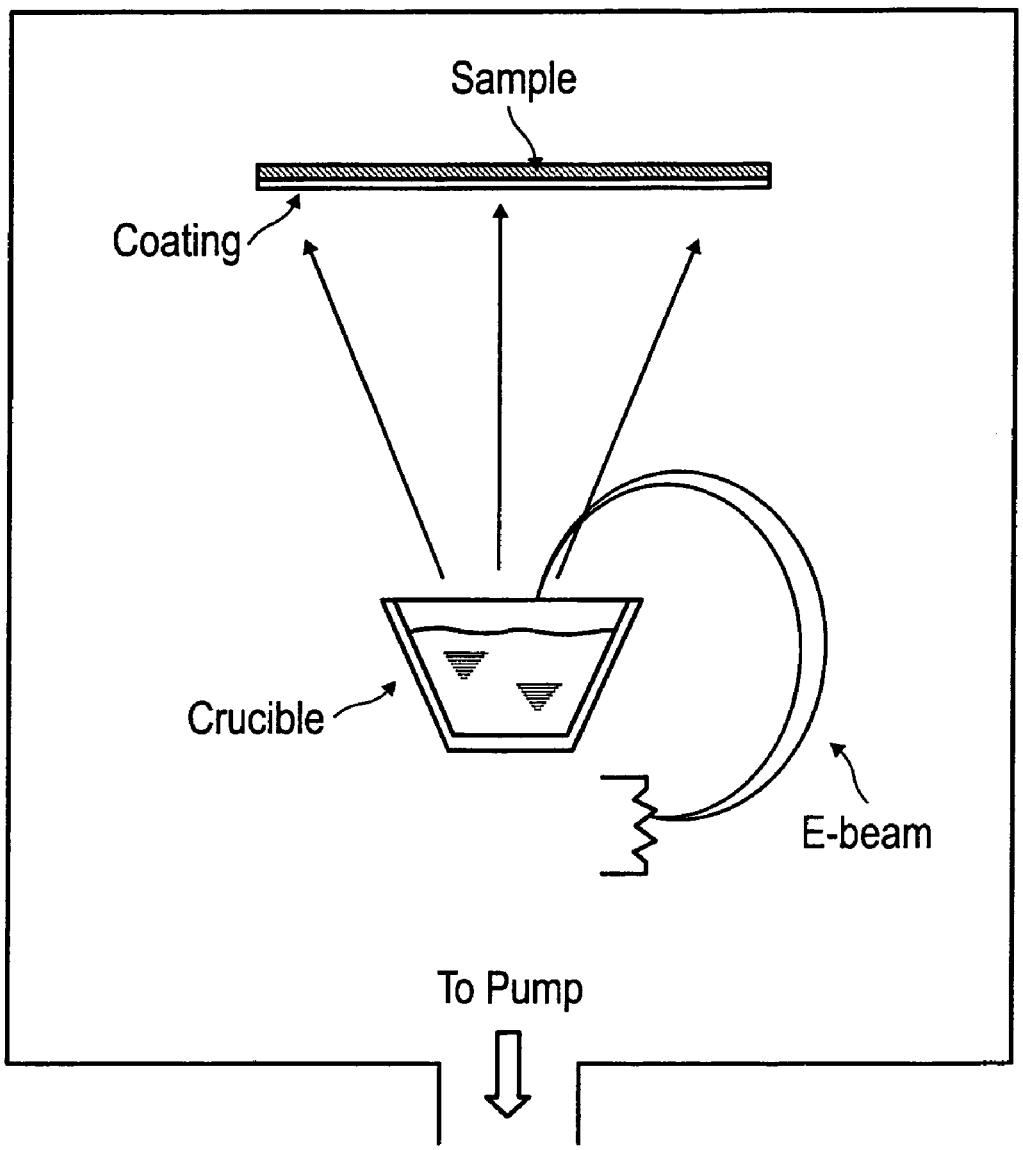
FIGS. 1A and 1B are general schematics of the PVD process.
Figure 1B:
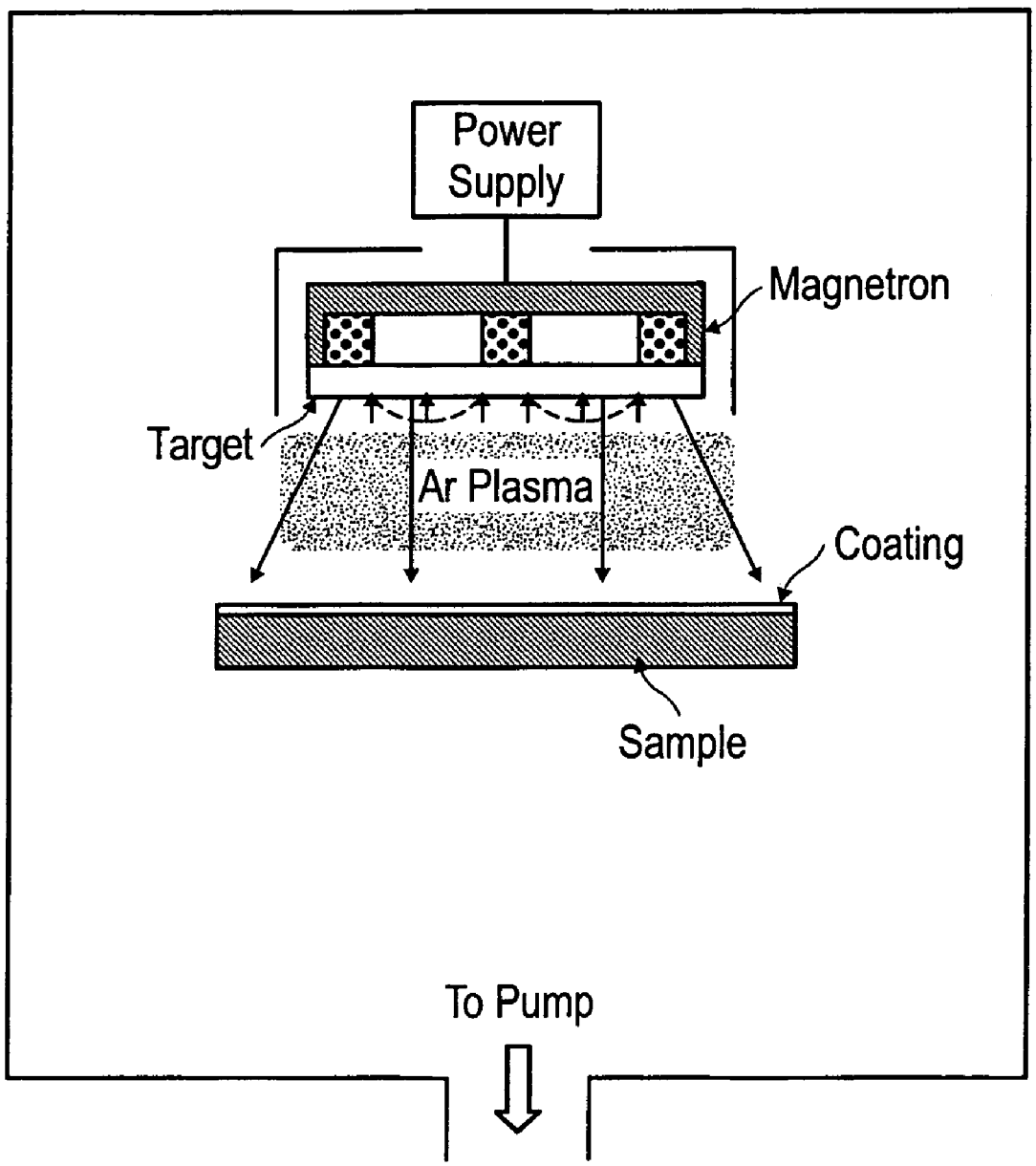
Figure 2:
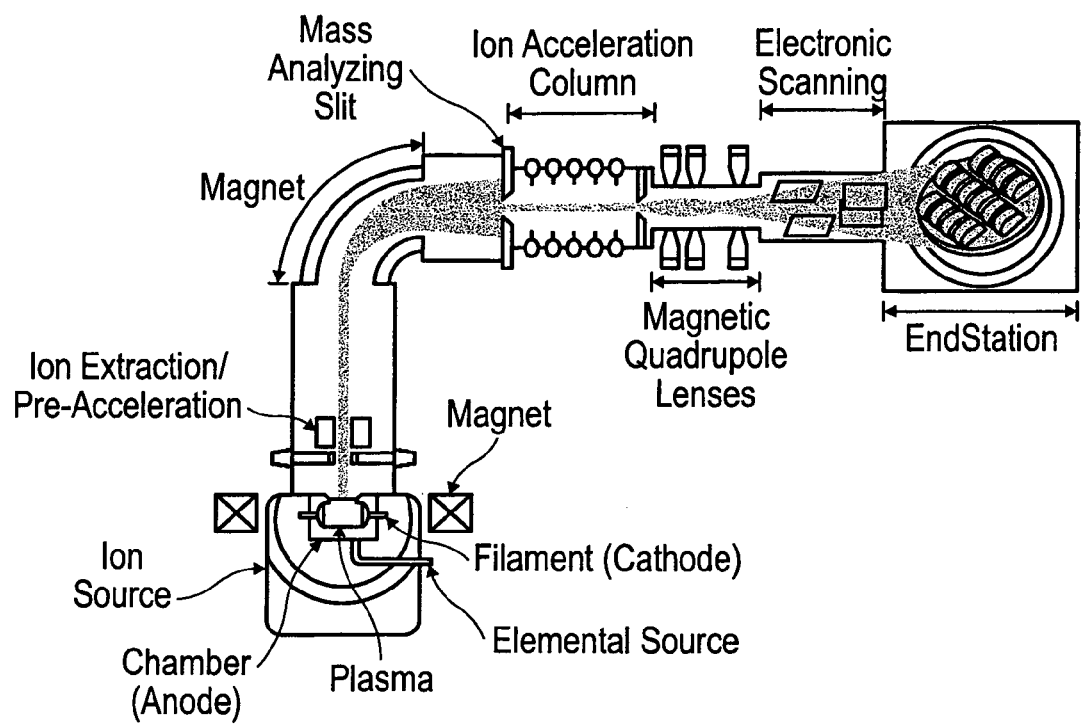
FIG. 2 is a general schematic of ion implantation.
Figure 3:
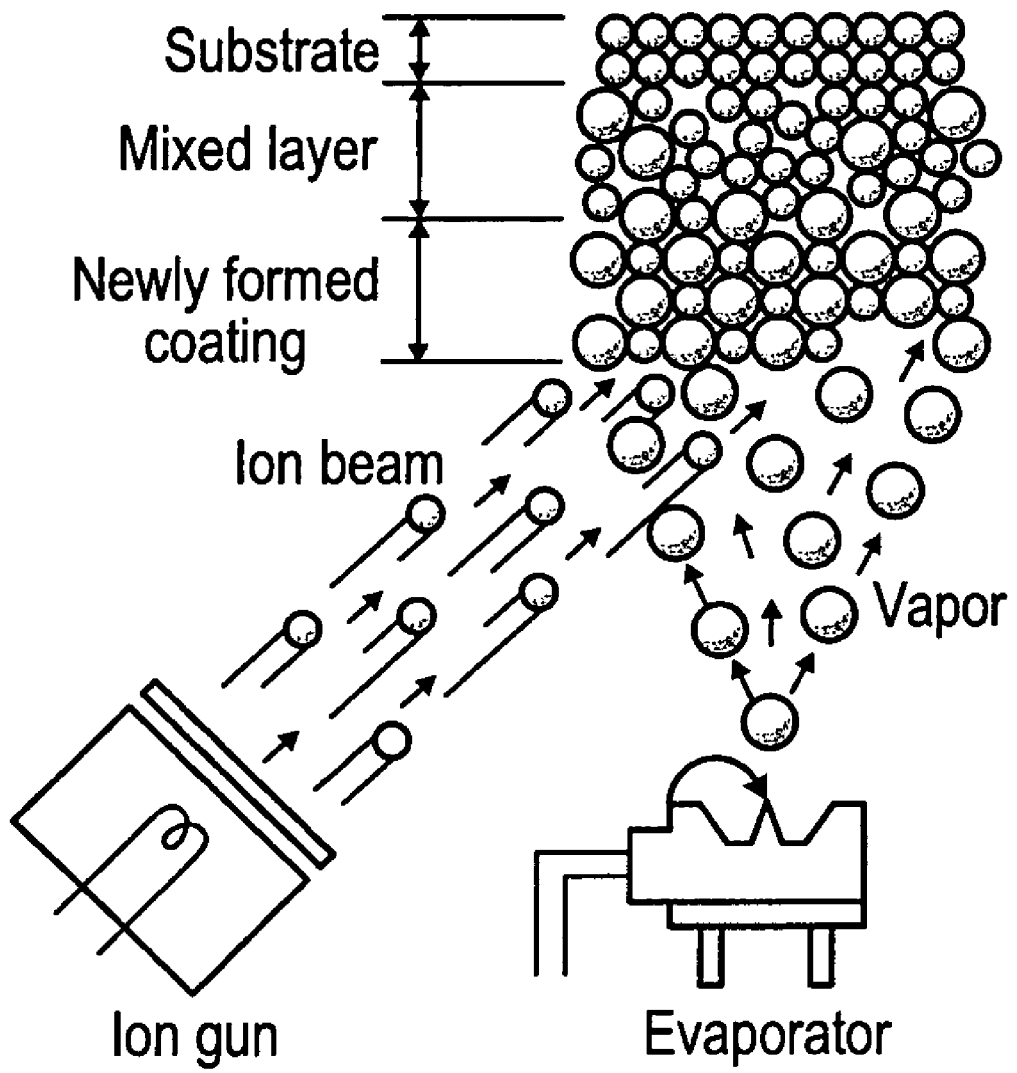
FIG. 3 is a general schematic of the ion-beam assisted deposition process.
Figure 4:
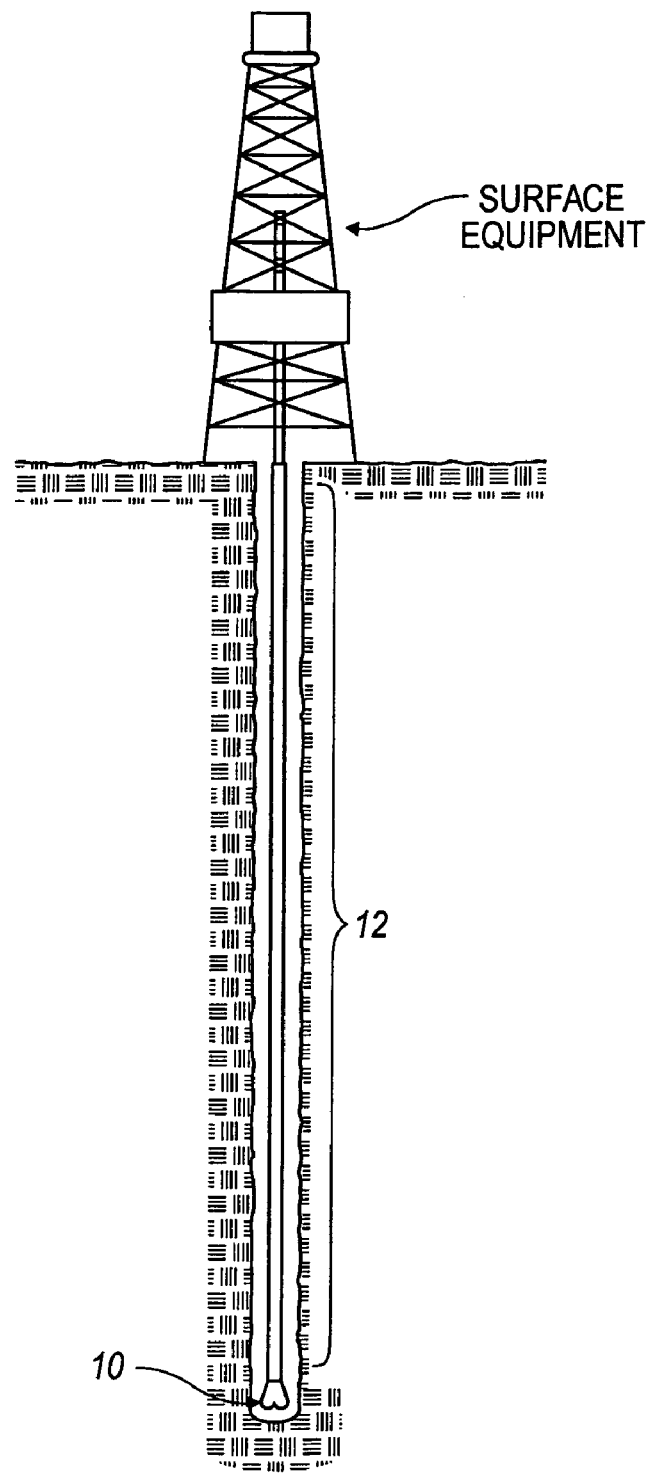
FIG. 4 depicts a drill rig.
Figure 5:
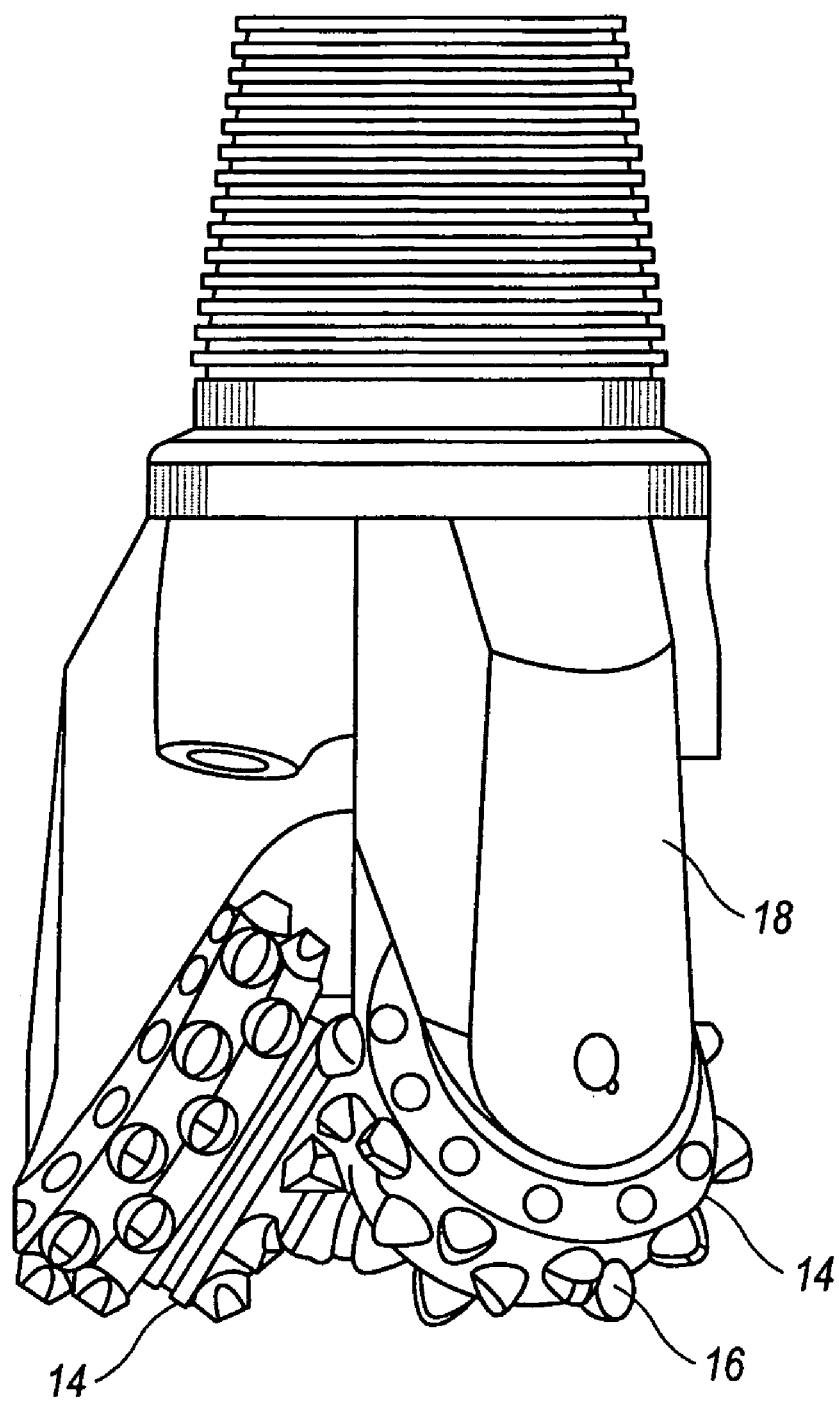
FIG. 5 depicts a roller cone bit.
Figure 6:
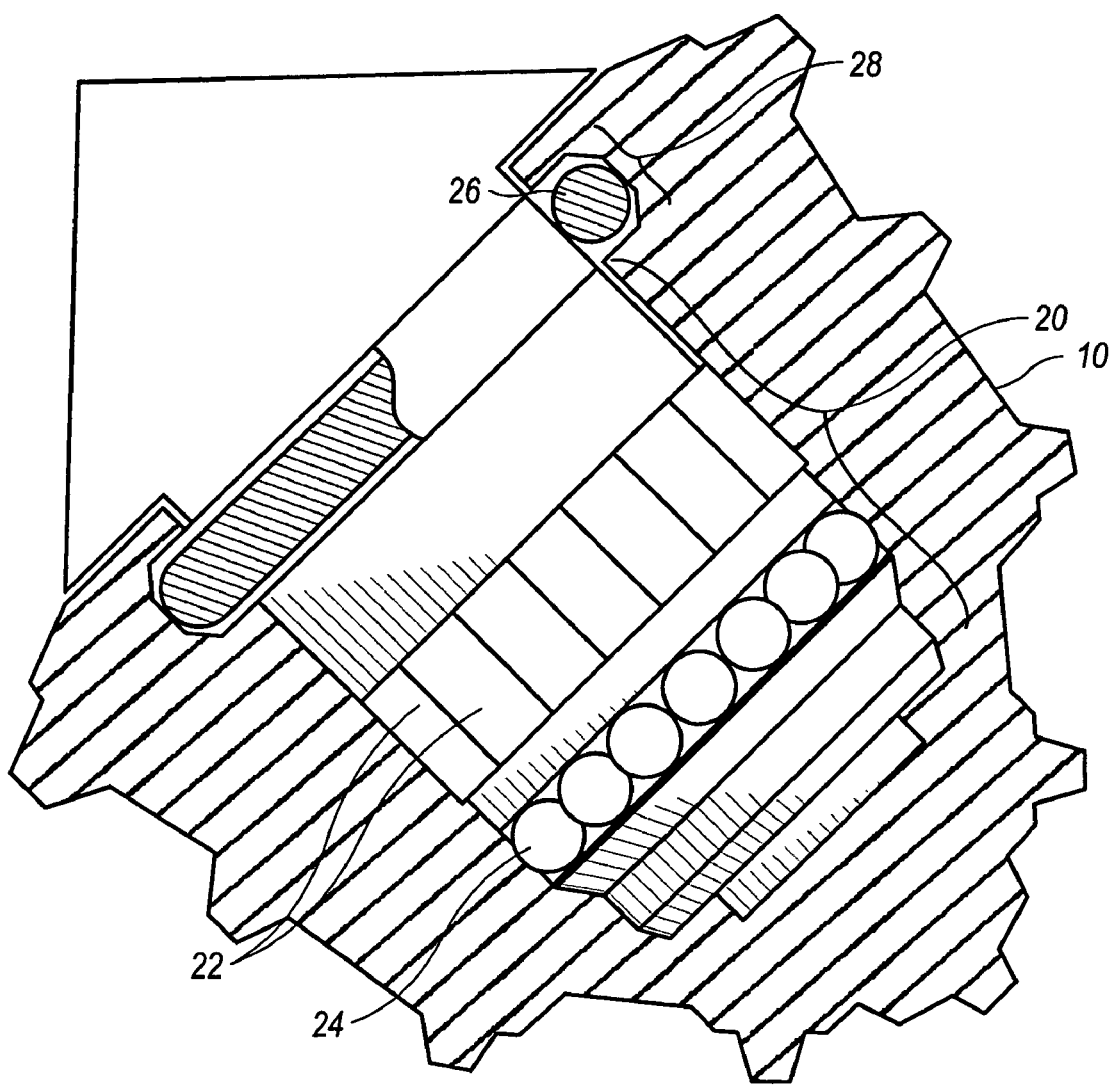
FIG. 6 is a sectional view of a portion of a roller cone bit.
Figure 7:
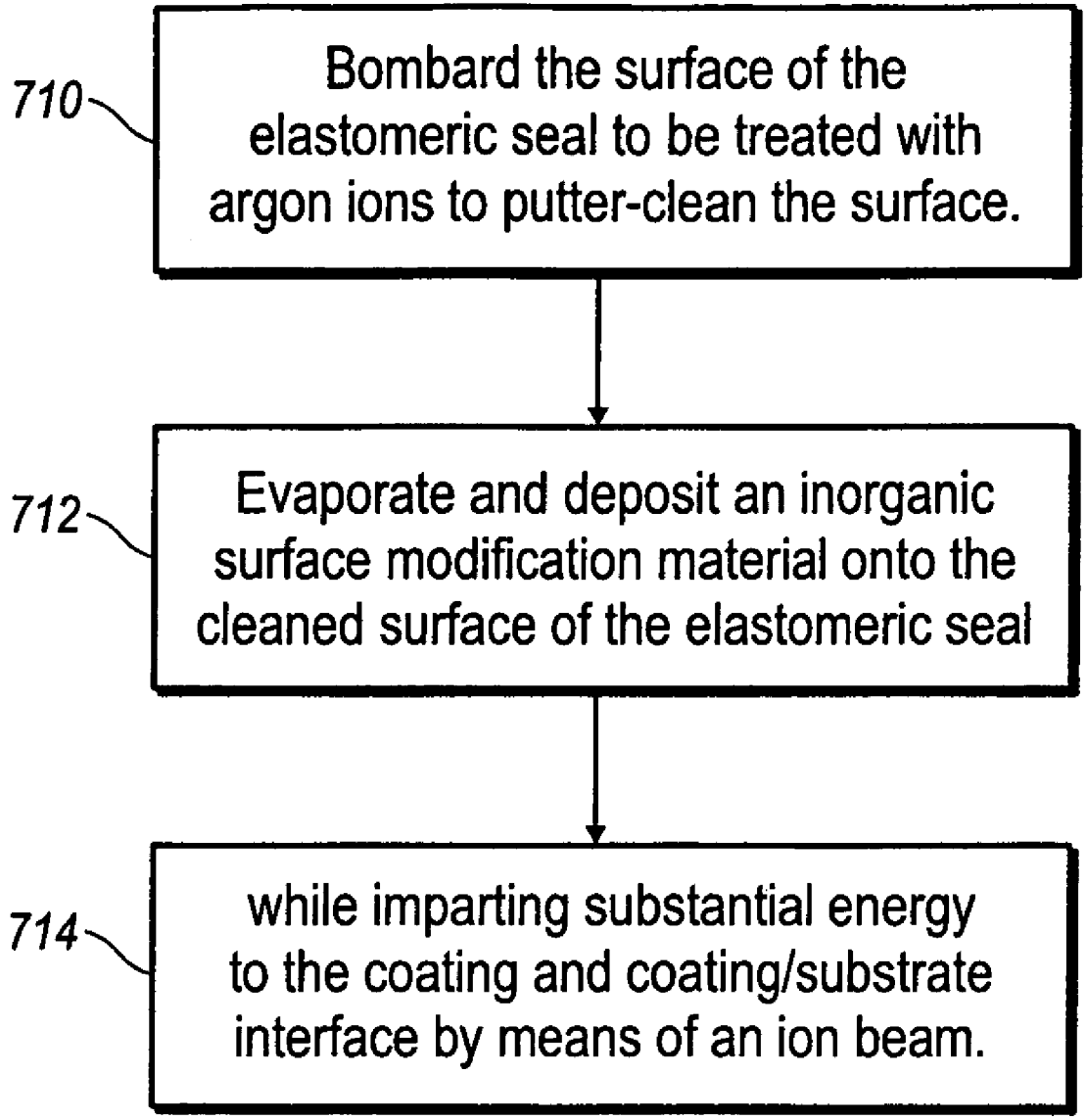
FIG. 7 is a flowchart of a preferred embodiment of the present innovations.

As illustrated in FIG. 7, in one example embodiment, the elastomeric seals of the present application are initially bombarded with argon ions to putter-clean the surface (step 710). An inorganic surface modification material, such as a metallic or ceramic material, is then evaporated and deposited onto the surface of the elastomeric seals (step 712) while an ion beam imparts substantial energy to the coating and coating/substrate interface (step 714). The inorganic material can be any metal, such as nickel or chromium. The inorganic material can also be any ceramic, including but not limited to chromium nitride or titanium carbide.

Four test seals of one embodiment of the present innovations were coated with chromium atoms. Argon ions were used to bombard the chromium atoms during deposition to enhance the coating adhesion and increase the coating density. Although this process can be carried out with varying beam densities, for example a beam current density of 0.01 to 5.0 mA/cm$^2$, the beam current density used for the test seals was 1.0 mA/cm$^2$. The ion energy can vary dramatically, such as from 50 to 2000 eV, and the ion energy used for the test seals was 1000 eV. The beam diameter was 8", and the seal was rotated to obtain a uniform coverage of both the coating and ion bombardment, though other means of preparation can be used. The result was, in that example, a coating thickness of 2.0 micrometers although the coating thickness can vary, and includes the ranges of 0.05 to 5 micrometers. The chromium atoms in the test example penetrated the elastomeric seal to a depth of no more than 5 nanometers. This process can be performed under wide range of pressures and includes the range of 0.1 to 1.0 millitorr. The test seals were treated under a pressure of 0.5 millitorr.

Figure 8:
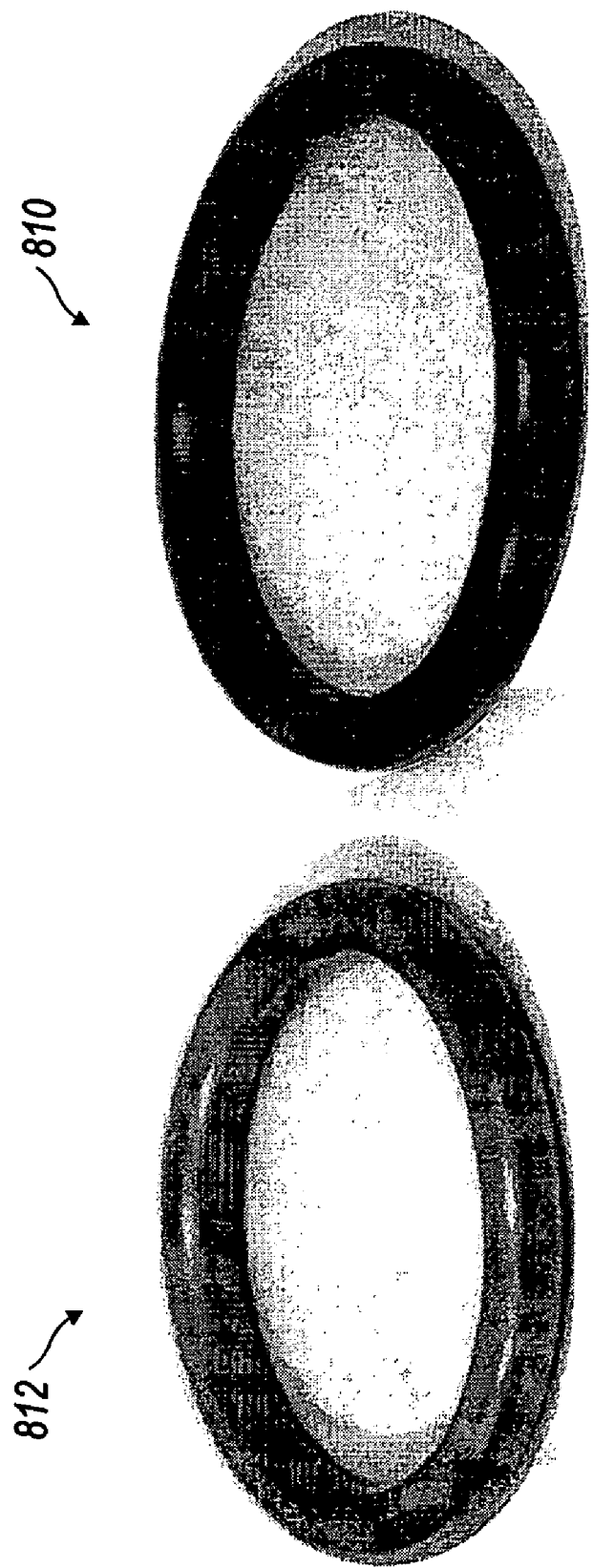
FIG. 8 shows a seal, which is a typical 0-ring made of an elastomeric material, and a seal coated by an inorganic surface modification material.

FIG. 8 shows a seal 810, which is a typical O-ring made of an elastomeric material. Seal 812 is the same type of O-ring coated by an inorganic surface modification material. In this particular case, the inorganic surface modification material was nickel.

Figure 9:
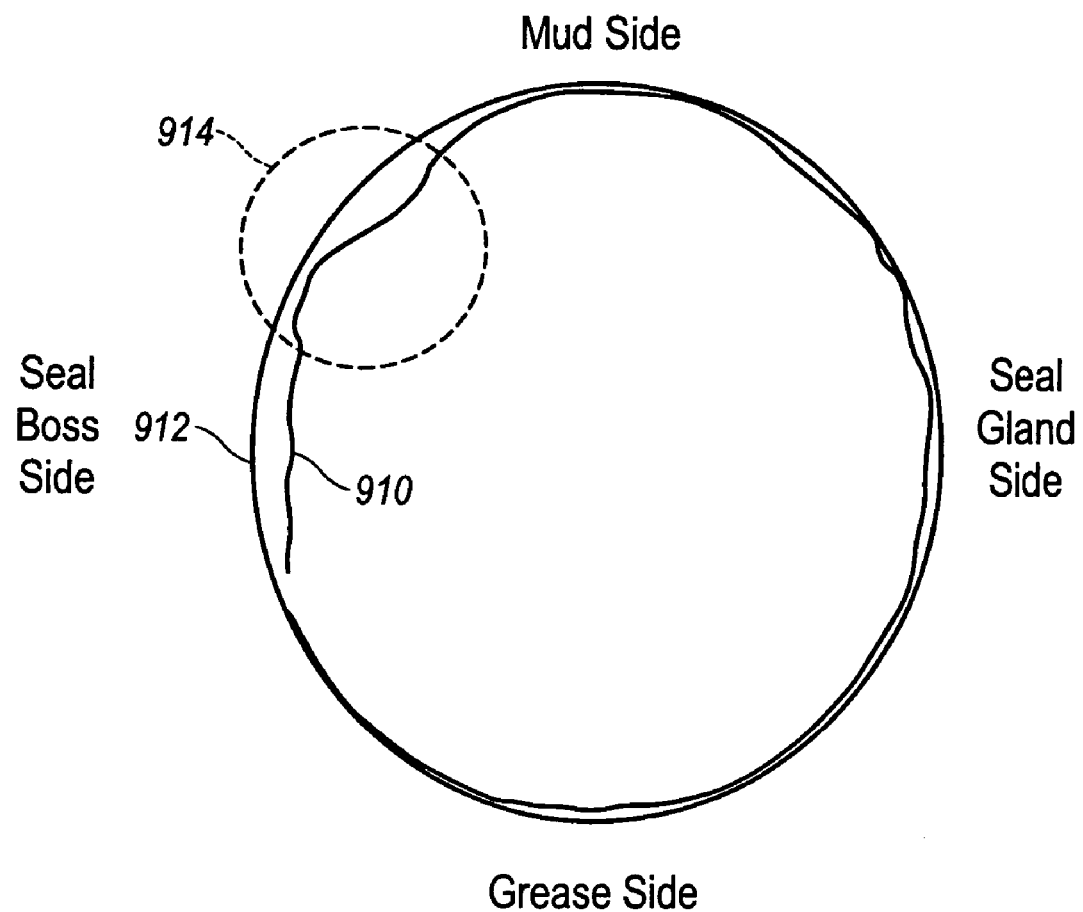
FIG. 9 shows a contour of a worn production seal and a contour from a new seal.

FIG. 9 shows a contour 910, which is digitized profile of the cross-section of a worn production seal. Contour 912 is the profile from a new seal. As shown by the indentations in contour 910, the abrasive particles tend to accumulate near the front edge of the sealing area (the flat zone on seal boss side). The abrasive conglomerates will wear away the seal to result in a secondary wear region indicated within the circled area 914. This, in turn, allows more accumulation of the abrasive particles and accelerates the penetration of wear particles into the sealing area. Accordingly, it is believed that the inorganic coatings have a tendency not only to reduce the wear in primary sealing area but also in the secondary wear area because of the hard coating.

Figure 10:
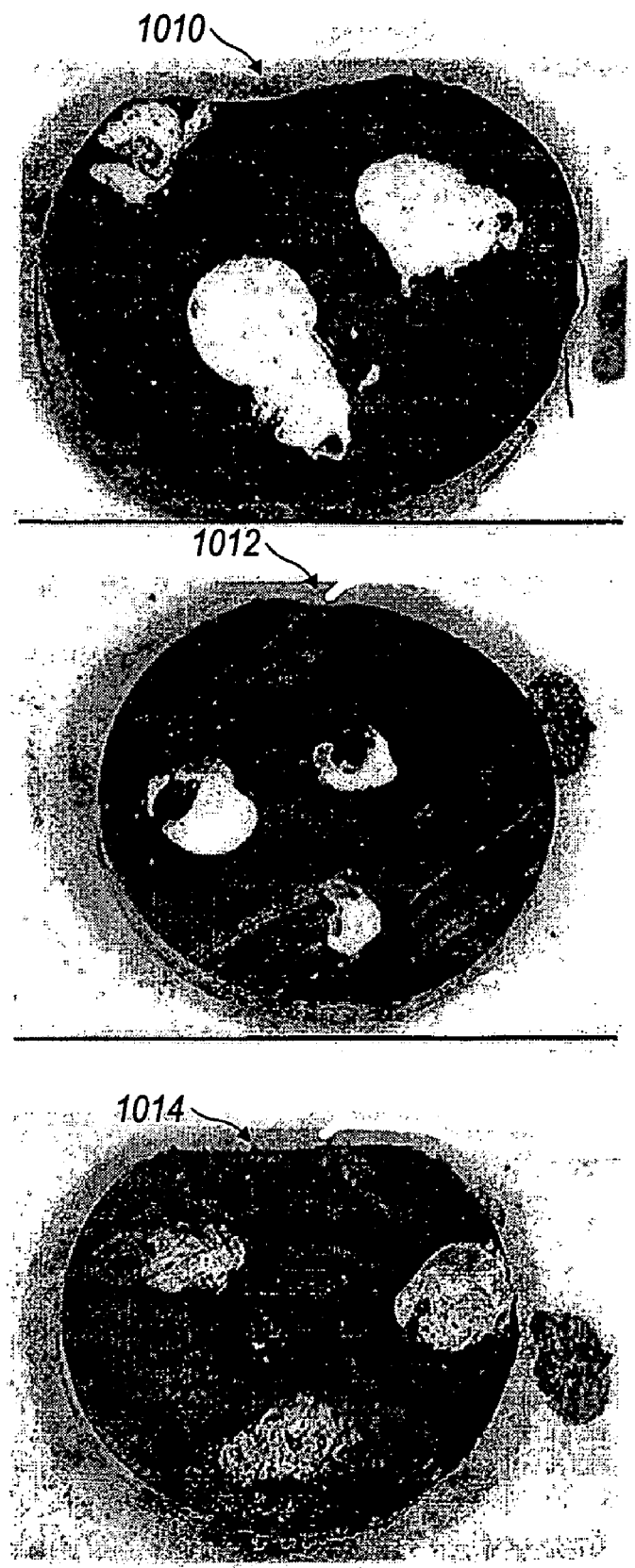
FIG. 10 shows the wear profiles for three untreated seals after they were tested under accelerated drilling conditions.
Figure 11A:
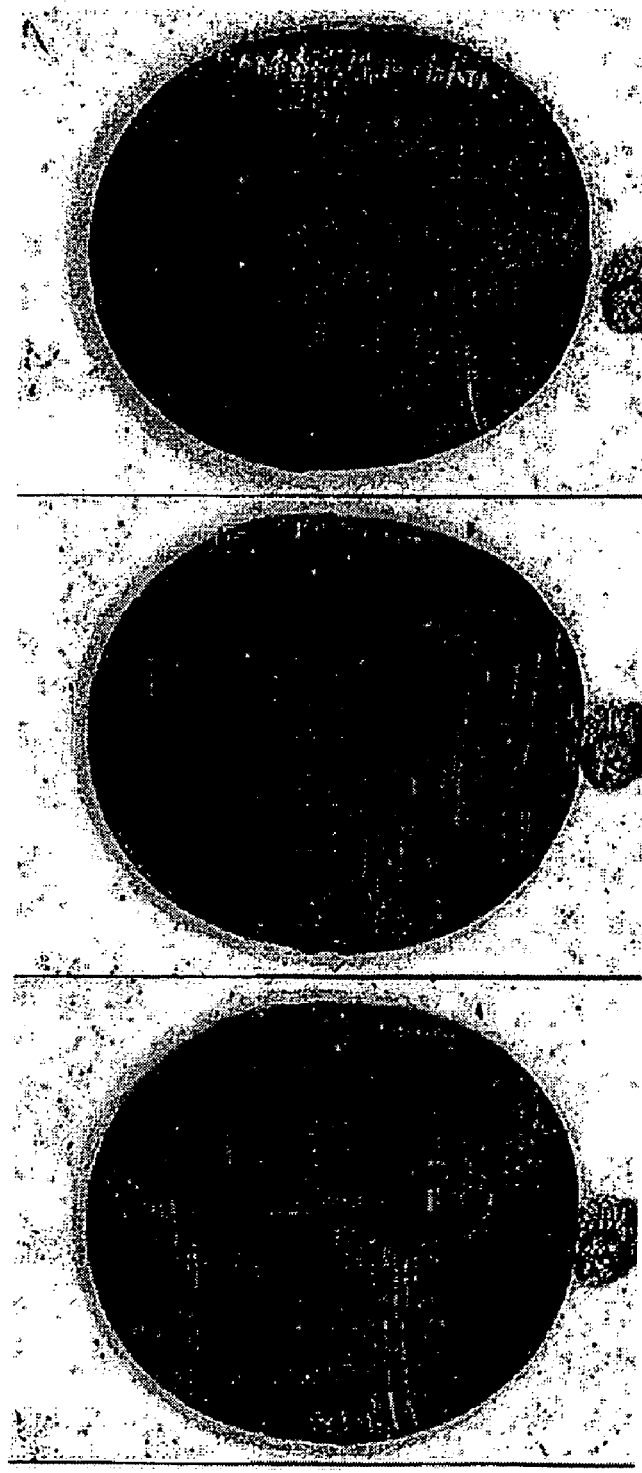
FIGS. 11A–11D show the wear profiles for four test seals treated by a preferred embodiment of the present innovations after they were tested under accelerated drilling conditions.
Figure 11B:
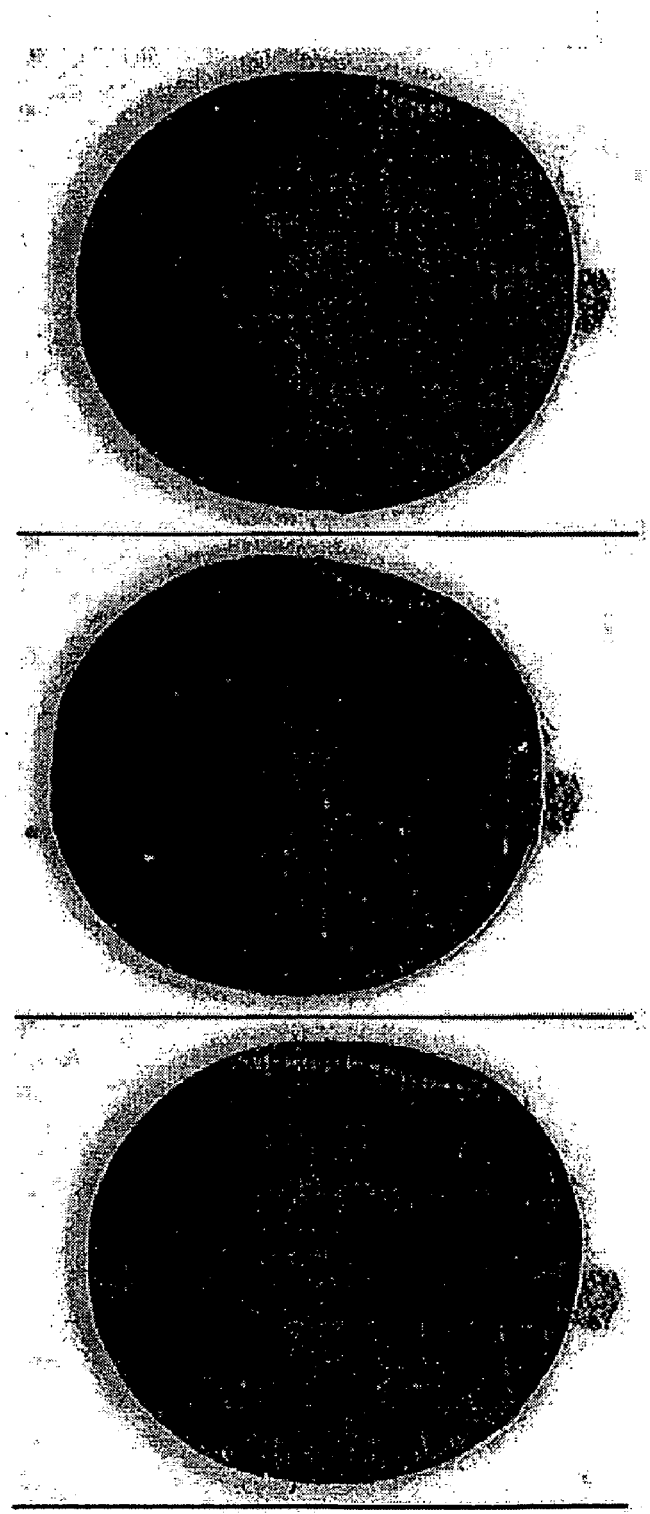
Figure 11C:
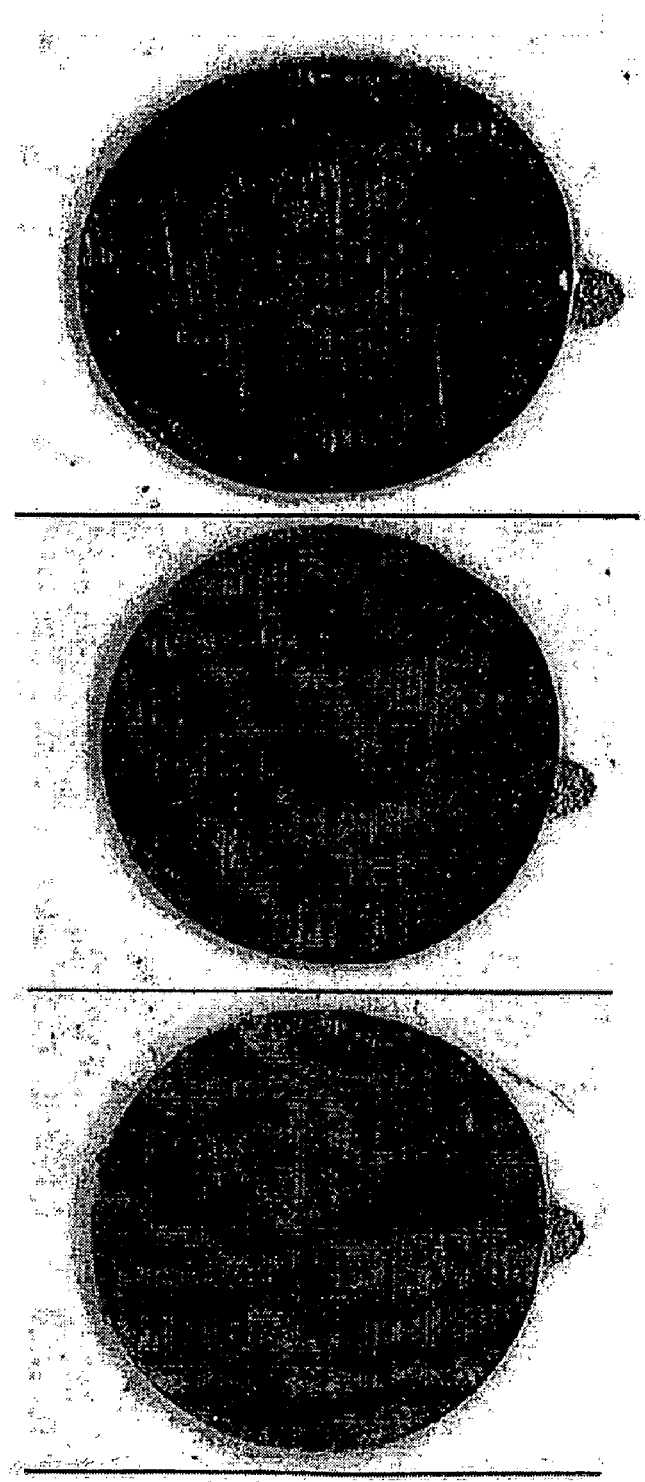
Figure 11D:
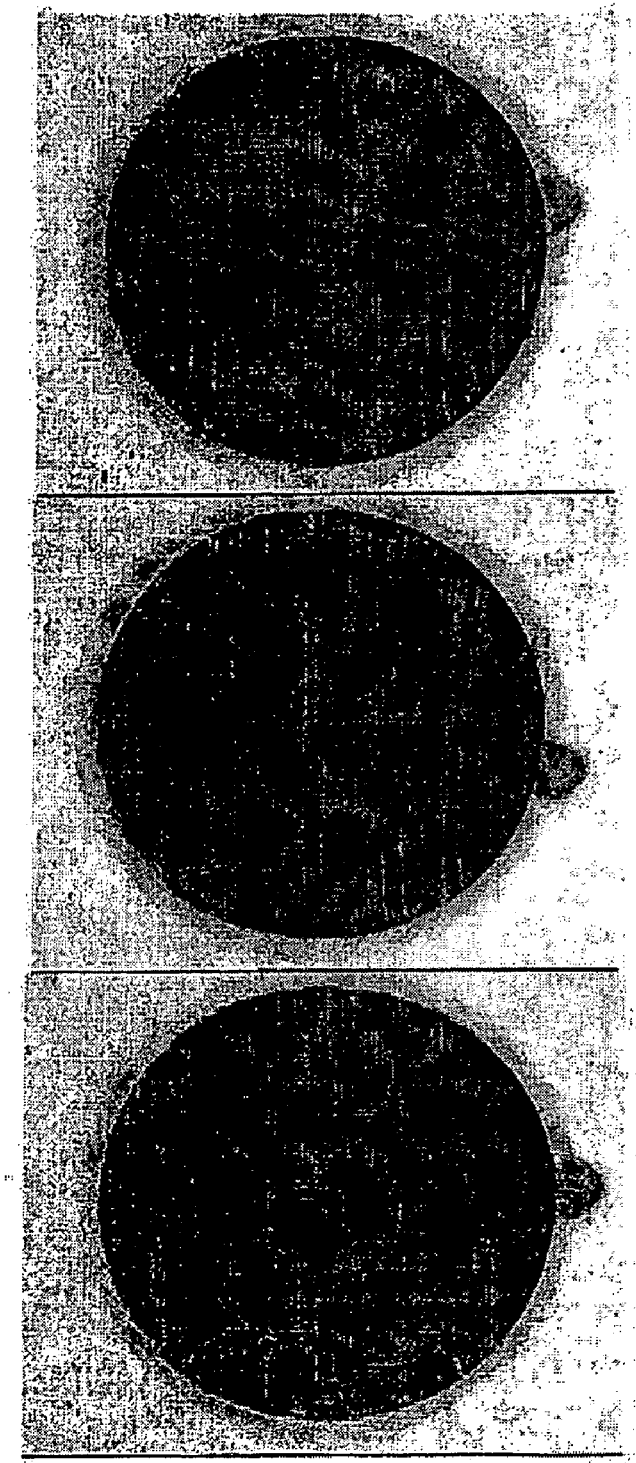

FIG. 10 shows the wear profiles for three untreated seals after they were tested under accelerated drilling conditions. As indicated by references 1010, 1012, and 1014, the untreated seals show signs of wear on the dynamic surface. The untreated seals also show signs of wear in the secondary region.

FIGS. 11A–11D show the wear profiles for the four test seals treated as described above. The four test seals were tested under the same accelerated drilling conditions as the three untreated seals.

In comparing the wear profiles of the treated seals against the wear profiles of the untreated seals, the wear on the dynamic surface is less severe on the treated seals. In addition, the secondary wear in front of the sealing region is also not as noticeable on the treated seals. Hence, the inorganic coating improves the wear resistance of the seal at the dynamic surface. The inorganic coating also provides protection against the abrasive particles that tend to accumulate near the front end of the sealing area. It is believed, although not proven, that the inorganic coating may also improve wear resistance by minimizing sticking between the seal surface and adjacent surfaces.

According to a disclosed class of innovative embodiments, there is provided: A seal comprising: an elastomeric body having a dynamic sealing interface; and an inorganic surface modification material which is deposited into the surface of the elastomeric body, and which increases the hardness of the surface; whereby, under dynamic sealing conditions, wear and friction characteristics of the seal at the dynamic sealing interface is improved.

According to a disclosed class of innovative embodiments, there is provided: A seal comprising: an elastomeric body; and an inorganic material which is coated on and impregnated into the surface of the elastomeric body.

According to a disclosed class of innovative embodiments, there is provided: A method for modifying the surface composition of a seal, comprising the actions of: bombarding a surface of the seal with ions of an inorganic material, while also bombarding the surface with at least one other source of energy.

According to a disclosed class of innovative embodiments, there is provided: A method of improving the wear resistance of elastomeric seals, comprising the step of: depositing an inorganic material onto the surface of an elastomeric seal while an ion beam bombards the surface during deposition to thereby enhance wear resistance.

According to a disclosed class of innovative embodiments, there is provided: A method of improving the wear resistance of elastomeric seals, comprising the step of: using an electron beam to evaporate and deposit an inorganic material onto the surface of an elastomeric seal while an ion beam bombards the surface of the seal during deposition to thereby enhance wear resistance.

According to a disclosed class of innovative embodiments, there is provided: A system for improving the wear resistance of elastomeric seals comprising: an electron beam to evaporate and deposit an inorganic material onto the surface of an elastomeric seal; and an ion beam to bombard the surface of the seal during deposition of the inorganic material to thereby enhance wear resistance.

According to a disclosed class of innovative embodiments, there is provided: An elastomeric seal, comprising a surface inorganic coating thereon which is less than 5 micrometers thick.

According to a disclosed class of innovative embodiments, there is provided: An elastomeric seal, comprising a surface non-polymeric coating thereon which is less than 5 micrometers thick.

According to a disclosed class of innovative embodiments, there is provided: A rock bit, comprising rotary elements rotatably mounted onto spindles, and dynamic seals between the spindles and the elements; wherein at least one of the dynamic seals comprises an elastomeric material coated with a harder surface material which is non-polymeric and predominantly inorganic.

According to a disclosed class of innovative embodiments, there is provided: A rock bit, comprising rotary elements rotatably mounted onto spindles, and dynamic seals between the spindles and the elements; wherein at least one of the dynamic seals comprises an elastomeric material coated with an inorganic material.

According to a disclosed class of innovative embodiments, there is provided: A drill rig, comprising a rock bit having rotary elements rotatably mounted onto spindles, and dynamic seals between the spindles and the elements; wherein at least one of the dynamic seals comprises an elastomeric material coated with a harder surface material which is non-polymeric and predominantly inorganic.

According to a disclosed class of innovative embodiments, there is provided: A drill rig, comprising a rock bit having rotary elements rotatably mounted onto spindles, and dynamic seals between the spindles and the elements; wherein at least one of the dynamic seals comprises an elastomeric material coated with an inorganic material.

According to a disclosed class of innovative embodiments, there is provided: A method of sealing a dynamic interface, comprising the use of an elastomeric seal body bearing a surface coating of an inorganic material which is harder than the elastomer.

According to a disclosed class of innovative embodiments, there is provided: A method of drilling, comprising the use of a rock drill bit having an elastomeric seal body bearing a surface coating of an inorganic material which is harder than the elastomer.

Definitions

Following are short definitions of the usual meanings of some of the technical terms which are used in the present application. (However, those of ordinary skill will recognize whether the context requires a different meaning.) Additional definitions can be found in the standard technical dictionaries and journals.

The term "hardness" is used to refer to a substance's resistance to deformation, usually by indentation. However, the term may also refer to stiffness or temper, or to resistance to scratching, abrasion, or cutting. It is the property of a substance which gives it the ability to resist being permanently deformed (bent, broken, or have its shape changed) when a load is applied. The greater the hardness of a substance, the greater resistance it has to deformation.

The term "non-polymeric" is used to describe compounds that do not have repeating units, i.e. any compound that is not a polymer.

The term "dynamic seal" is used to describe a seal that is used in an environment that subjects it or a mating surface to movement.

The term "dynamic surface" is used to describe the surface of a dynamic seal on which relative motion occurs.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

In the presently preferred embodiments, an inorganic material is deposited onto the surface of the seals. However, any material that increases the stiffness or hardness of the surface of the seal may be used.

In various preferred embodiments, nickel or chromium metal is deposited onto the surface of the seals. However, any suitable metal may be used.

In various preferred embodiments, chromium nitride or titanium carbide is deposited onto the surface of the seals. However, any suitable ceramic may be used.

In the presently preferred embodiments, the metallic or ceramic material is deposited onto the surface of the seals by means of physical vapor deposition. However, alternatively but less preferably, any suitable method for surface deposition, such as chemical dipping, may be used.

In the presently preferred embodiments, the metallic or ceramic material is vaporized from a solid or liquid source in the form of atoms or molecules. However, other means of generating a plasma, such as microwave or RF excitation of gases, may be used.

In the presently preferred embodiments, the metal or ceramic material is deposited onto the surface of the seals by means of ion-beam assisted deposited. However, any suitable method of deposition may be used.

Although the entire surface of the test seals of the present application was coated, this is not always necessary. An embodiment of the present innovations may have only certain parts of the seal surface being coated depending on the requirements of the particular application, such as the edges or just one side of the seal.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. A method for modifying the surface composition of a seal, comprising the actions of:
    bombarding a surface of the seal with ions of an inorganic material, while also
    bombarding the surface with at least one other source of energy;
    wherein the seal is an elastomeric seal.

2. The method of claim 1, wherein the method includes the step of bombarding the surface of the elastomeric seal with argon ions to putter-clean the surface before bombardment with inorganic ions onto the surface of the seal.

3. The method of claim 1, wherein the seal is an elastomeric seal used in a rock drill bit.

4. The method of claim 1, wherein the seal is used in a rock drill bit.

5. A method of improving the wear resistance of elastomeric seals, comprising the step of:
depositing an inorganic material onto the surface of an elastomeric seal while an ion beam bombards the surface during deposition to thereby enhance wear resistance.

6. The method of claim 5, wherein the method includes the step of bombarding the surface of the elastomeric seal with argon ions to putter-clean the surface before depositing the inorganic material onto the surface of the seal.

7. The method of claim 5, wherein the inorganic material is a metal.

8. The method of claim 7, wherein the metal is one of a group consisting of chromium and nickel.

9. The method of claim 5, wherein the inorganic material is a ceramic.

10. The method of claim 9, wherein the ceramic is one of a group consisting of chromium nitride and titanium carbide.

11. A method of improving the wear resistance of elastomeric seals, comprising the step of:
using an electron beam to evaporate and deposit an inorganic material onto the surface of an elastomeric seal while an ion beam bombards the surface of the seal during deposition to thereby enhance wear resistance.

12. The method of claim 11, wherein the method includes the step of bombarding the surface of the elastomeric seal with argon ions to putter-clean the surface before depositing metallic material onto the surface of the seal.

13. The method of claim 11, wherein the inorganic material is a metal.

14. The method of claim 13, wherein the metal is one of a group consisting of chromium and nickel.

15. The method of claim 11, wherein the inorganic material is a ceramic.

16. The method of claim 15, wherein the ceramic is one of a group consisting of chromium nitride and titanium carbide.

17. The method of claim 11, wherein the seal is used in a rock drill bit.

* * * * *